(12) United States Patent  
Matsukawa (10) Patent No.: US 7,481,945 B2  
(45) Date of Patent: Jan. 27, 2009

(54) POLISHING PROGRESS MONITORING METHOD AND DEVICE THEREOF, POLISHING DEVICE, SEMICONDUCTOR DEVICE PRODUCTION METHOD, AND SEMICONDUCTOR DEVICE

(75) Inventor: Eiji Matsukawa, Yotsukaido (JP)

(73) Assignee: Nikon Corporation, Tokyo (JP)

( * ) Notice: Subject to any disclaimer, the term of this patent is extended or adjusted under 35 U.S.C. 154(b) by 645 days.

(21) Appl. No.: 10/433,395

(22) PCT Filed: Nov. 7, 2001

(86) PCT No.: PCT/JP01/09736

§ 371 (c)(1),  
(2), (4) Date: Apr. 12, 2005

(87) PCT Pub. No.: WO02/47141

PCT Pub. Date: Jun. 13, 2002

(65) Prior Publication Data

US 2004/0053500 A1    Mar. 18, 2004

(30) Foreign Application Priority Data

Dec. 4, 2000    (JP)  ............................. 2000-367876

(51) Int. Cl.  
*C23C 15/00* (2006.01)  
*H01L 21/00* (2006.01)

(52) U.S. Cl. ............................. 216/85; 216/84; 216/89; 216/92; 451/6; 451/41; 438/14; 438/692

(58) Field of Classification Search ............... 216/84, 216/89, 92, 85; 451/6, 41; 438/692  
See application file for complete search history.

(56) References Cited

U.S. PATENT DOCUMENTS

| 5,433,651 | A | 7/1995 | Lustig et al. |
| 6,142,855 | A | 11/2000 | Nyui et al. |
| 6,271,047 | B1 * | 8/2001 | Ushio et al. .................... 438/14 |
| 6,342,166 | B1 * | 1/2002 | Ide et al. ........................ 216/84 |
| 6,361,646 | B1 * | 3/2002 | Bibby et al. ............. 156/345.1 |
| 6,489,624 | B1 | 12/2002 | Ushio et al. |

FOREIGN PATENT DOCUMENTS

| EP | 0 881 040 A2 | 12/1998 |
| JP | 10-229060 A * | 8/1998 |
| JP | 10335288 | 12/1998 |
| JP | 11033901 | 2/1999 |
| JP | 11198033 | 7/1999 |

\* cited by examiner

*Primary Examiner*—Shamim Ahmed  
(74) *Attorney, Agent, or Firm*—Morgan, Lewis & Bockius LLP (57) ABSTRACT

During the polishing of a wafer 2, the wafer 2 is illuminated with measuring light emitted from a light source 21, and the spectroscopic intensity of the reflected light is detected by a linear sensor 31. The signal processing part 11 monitors the polishing state of the wafer 2 on the basis of detection signals from the sensor 31, and detects the polishing endpoint of the wafer 2. The shutter mechanism control part 14 controls the motor 13b of the shutter mechanism 13 in response to the polishing endpoint detection signal from the signal processing part 11, and causes a light blocking member 13a to advance into the light path of the measuring light, so that the measuring light is blocked with respect to the wafer 2. As a result, the effect of the measuring light used for the monitoring of the polishing state on the object of polishing can be reduced.

16 Claims, 5 Drawing Sheets

POLISHING PROGRESS MONITORING METHOD AND DEVICE THEREOF, POLISHING DEVICE, SEMICONDUCTOR DEVICE PRODUCTION METHOD, AND SEMICONDUCTOR DEVICE

TECHNICAL FIELD

The present invention relates to a polishing state monitoring method and device, polishing apparatus, semiconductor device manufacturing method and semiconductor device which are suitable for use in the flattening polishing, etc., of semiconductor devices in a method for manufacturing semiconductor devices such as ULSIs.

BACKGROUND ART

In recent years, chemical mechanical polishing (or chemical mechanical planarization; hereafter referred to as "CMP") techniques have been used as global flattening techniques for the surfaces of semiconductor devices, etc. CMP is a process in which indentations and projections in the surfaces of wafers are removed by using a chemical action (dissolution by means of a polishing agent or solvent) together with physical polishing. A polishing apparatus which performs polishing by CMP is equipped with a polishing body and a holding part that holds the object of polishing; the above-mentioned object of polishing is polished by applying a load between the above-mentioned polishing body and the above-mentioned object of polishing, and causing relative motion between the above-mentioned polishing body and the above-mentioned object of polishing, in a state in which a polishing agent is interposed between the above-mentioned polishing body and the above-mentioned object of polishing.

In CMP techniques, monitoring of the polishing state during the polishing process (in-situ monitoring; i.e., detection of the amount of polishing, film thickness or polishing endpoint, etc.) is a problem; there is a great need for such monitoring in order to make the process more efficient.

Recently, monitoring of the polishing state (in-situ endpoint determination and in-situ film thickness measurement, etc.) using optical measurements, i.e., the measurement of reflected light without spectroscopic analysis, or spectroscopic reflection measurements, has been considered effective (Japanese Patent No. 2561812, Japanese Patent Application Kokai No. H11-33901, etc.). In the case of polishing state monitoring devices that perform monitoring of the polishing state by means of such optical measurements, the wafer that constitutes the object of polishing is illuminated with measuring light during CMP, and the film thickness, amount of polishing or polishing endpoint is detected during polishing according to variations in the reflectivity or variations in the spectroscopic reflectivity.

Conventionally, furthermore, even when the polishing of a certain wafer has been completed, the above-mentioned measuring light is supplied to the next wafer that is to be polished, so that illumination with a fixed quantity of light is constantly continued. Accordingly, even after the completion of the polishing of a wafer has been detected, this wafer continues to be illuminated by a fixed quantity of the above-mentioned measuring light until the wafer is moved from the polishing position (the position where the wafer is illuminated with the above-mentioned measuring light).

Meanwhile, for example, in a polishing state monitoring device that monitors the polishing state by spectroscopic reflection measurements, it is conceivable that the acquisition of a reference signal and the measurement of dark noise might be performed prior to the polishing of the object of polishing such as a wafer in order to improve the monitoring precision of the polishing state (although this is not seen in the prior art). It is conceivable that the acquisition of a reference signal might be accomplished by conveying a reference mirror which has the same size as the wafer, etc., and which has specified reflection characteristics to the polishing position by means of (for example) the conveying apparatus that conveys the wafer, etc., to the polishing position, and by illuminating this reference mirror with the measuring light. If such a reference signal is acquired beforehand, the monitoring precision of the polishing state can be improved by comparing this reference signal with the measurement signal obtained by illuminating the object of polishing with the measuring light. Furthermore, it is conceivable that the measurement of dark noise might be accomplished by conveying a dark noise measuring member that has the same size as the wafer, etc., and that shows more or less complete absorption of light to the polishing position by means of (for example) the conveying apparatus that conveys the wafer, etc., to the polishing position, and by illuminating this dark noise measuring member with the measuring light. The signal obtained from the detector in this state indicates noise (dark noise) consisting of both noise caused by stray light in the optical system (flare noise, etc.) and noise of the electrical system such as the detector. If dark noise is thus measured beforehand, the monitoring precision of the polishing state is improved by subtracting the dark noise component from the measurement signal obtained by illuminating the object of polishing with the measuring light, and thus removing the noise component. Furthermore, such acquisition of a reference signal and measurement of dark noise are performed periodically at an appropriate frequency.

However, it has been ascertained that if the wafer continues to be illuminated with measuring light following polishing, there is a danger that problems will occur, for example, in the case of polishing of process wafers that have Cu. Here, an example to be considered is a case in which a so-called damascene is formed by polishing the Cu film in a process wafer which is in a state in which devices such as transistors that have pn junctions and inter-layer insulating films consisting of $SiO_2$ are successively formed, and a Cu film is formed over the entire surface on top of these parts. Even if such a process wafer is illuminated with light, the light will be blocked by the Cu film that covers the entire surface if this illumination is performed prior to the polishing of the Cu film, so that there is no problem. As the polishing of the Cu film progresses, the Cu film gradually becomes thinner, so that eventually the Cu film other than the portions of the inter-layer insulating film inside the holes are removed, thus forming a damascene, after which the polishing is ended. When the Cu film other than the portions of the inter-layer insulating film inside the holes is thus removed, light from the outside reaches the pn junction via the exposed inter-layer insulating film, so that a photo-electromotive force is generated in the pn junction, thus leading to the danger that the Cu will be corroded (oxidized) by the photoelectric cell effect.

Furthermore, as was described above, it is conceivable that the monitoring precision of the polishing state might be improved by acquiring a reference signal and measuring the dark noise. In such a case, a reference mirror or dark noise measuring member that has the same size as the wafer, etc., may be conveyed to the polishing position instead of the object of polishing (such as a wafer) using the conveying apparatus that is used for the wafer, etc. In this case, however, the conveying of the object of polishing to or from the polishing position and the acquisition of a reference signal or measurement of dark noise cannot be performed in parallel; accordingly, there is a danger that the polishing throughput will drop.

DISCLOSURE OF THE INVENTION

The present invention was devised in light of the above-mentioned facts; one object of the present invention is to provide a polishing state monitoring method and device which make it possible to reduce or eliminate the effect of the measuring light used for the monitoring of the polishing state on the object of polishing, and a polishing apparatus using this monitoring method and device.

Furthermore, another object of the present invention is to provide, on one hand, a semiconductor device manufacturing method which makes it possible to improve the yield by reducing or eliminating the likelihood of problems occurring such as the oxidation of the Cu film caused by the measuring light used for the monitoring of the polishing state, and which thus makes it possible to manufacture semiconductor devices at a lower cost than in conventional semiconductor device manufacturing methods, and also to provide, on the other hand, a low-cost semiconductor device.

Furthermore, another object of the present invention is to provide a polishing state monitoring device in which the conveying of the object of polishing to or from the polishing position and the acquisition of a reference signal or measurement of dark noise can be performed in parallel, so that the polishing throughput can be improved.

The polishing state monitoring method that constitutes a first aspect of the present invention is a polishing state monitoring method in which the object of polishing is illuminated with measuring light, and the polishing state of the above-mentioned object of polishing is monitored during the polishing of this object of polishing on the basis of the light obtained from the above-mentioned object of polishing as a result of illumination with the above-mentioned measuring light, wherein the above-mentioned measuring light is blocked or reduced with respect to the above-mentioned object of polishing after the polishing endpoint of the above-mentioned object of polishing has been detected.

In this first aspect, the measuring light that is used to monitor the polishing state is blocked or reduced with respect to the object of polishing after the polishing endpoint of the object of polishing has been detected; accordingly, the effect of the measuring light that is used to monitor the polishing state on the object of polishing can be reduced or eliminated.

There are no particular restrictions on the above-mentioned object of polishing; however, in cases where the object of polishing is (for example) a process wafer that has Cu, the corrosion of the Cu can be prevented. This is also true of the respective aspects of the present invention described later.

The polishing state monitoring method that constitutes a second aspect of the present invention is the above-mentioned first aspect, wherein a first period during which the above-mentioned object of polishing is illuminated with the above-mentioned measuring light, and a second period during which the above-mentioned measuring light is blocked or reduced with respect to the above-mentioned object of polishing, are repeated during the monitoring of the above-mentioned polishing state.

Even before the polishing of the object of polishing is completed, there are cases in which the measuring light has a deleterious effect on the object of polishing if the object of polishing is illuminated with this measuring light. Even in such cases, if the above-mentioned second aspect of the present invention is used, the above-mentioned first and second periods are repeated, so that the overall quantity of light with which the object of polishing is illuminated during the monitoring of the polishing state is reduced; accordingly, the effect of the measuring light on the object of polishing can be greatly reduced. Furthermore, in the above-mentioned second aspect, the object of polishing is not constantly illuminated with a fixed quantity of measuring light during the monitoring of the polishing state; however, if the repeating periods of the above-mentioned first and second periods are set at appropriately short values, the polishing state can be monitored substantially in real time.

The polishing state monitoring method that constitutes a third aspect of the present invention is a polishing state monitoring method in which the object of polishing is illuminated with measuring light, and the polishing state of the above-mentioned object of polishing is monitored during the polishing of this object of polishing on the basis of the light obtained from the above-mentioned object of polishing as a result of illumination with the above-mentioned measuring light, wherein a first period during which the above-mentioned object of polishing is illuminated with the above-mentioned measuring light, and a second period during which the above-mentioned measuring light is blocked or reduced with respect to the above-mentioned object of polishing, are repeated during the monitoring of the above-mentioned polishing state.

As in the above-mentioned first and second aspects, it is desirable that the measuring light be blocked or reduced with respect to the object of polishing after the polishing endpoint of the object of polishing has been detected. However, if the above-mentioned first and second periods are repeated during the monitoring of the polishing state as in the above-mentioned third aspect, the effect of the measuring light on the object of polishing can be reduced compared to the above-mentioned conventional techniques even if the measuring light is not necessarily blocked or reduced with respect to the object of polishing following the polishing endpoint.

The polishing state monitoring device that constitutes a fourth aspect of the present invention is a polishing state monitoring device in which the above-mentioned object of polishing is illuminated with measuring light, and the polishing state is monitored on the basis of the light that is obtained from the above-mentioned object of polishing as a result of illumination with the above-mentioned measuring light, wherein the apparatus is equipped with a first measuring light control part that blocks or reduces the above-mentioned measuring light with respect to the above-mentioned object of polishing in response to a polishing endpoint detection signal.

Using this fourth aspect, the polishing state monitoring method based on the above-mentioned first aspect can be realized, and the effect of the measuring light that is used to monitor the polishing state on the object of polishing can be reduced or eliminated.

The polishing state monitoring device that constitutes a fifth aspect of the present invention is the above-mentioned fourth aspect, where the above-mentioned first measuring light control part includes a control part that electrically controls the light-emitting state of the above-mentioned light source.

In this fifth aspect, the light source is electrically controlled; accordingly, a mechanical shutter mechanism of the type used in the sixth aspect described below is unnecessary, so that the construction is simplified, and costs are reduced. For example, if the light source is an LED such as a white LED, the measuring light can be switched on and off with respect to the object of polishing by switching the current that flows through this LED on and off. Furthermore, the measuring light can be reduced with respect to the object of polishing by reducing the current that flows through this LED.

The polishing state monitoring device that constitutes a sixth aspect of the present invention is the above-mentioned fourth aspect, wherein the above-mentioned first measuring light control part includes a mechanical shutter mechanism.

If the first measuring light control part is constructed using a mechanical shutter mechanism as in this sixth aspect, the measuring light with which the object of polishing is illuminated can be appropriately controlled even in cases where the light source used is a light source (e.g., a xenon lamp) in which there is a danger that problems in terms of useful life and response characteristics, etc., will arise if the light source is switched on and off by means of electrical control. Furthermore, in the above-mentioned fourth aspect, the above-mentioned first measuring light control part may also be constructed using (for example) an electro-optical-type shutter such as a liquid crystal shutter.

The polishing state monitoring device that constitutes a seventh aspect of the present invention is the above-mentioned sixth aspect, wherein the above-mentioned shutter mechanism includes a reference mirror that is used to obtain a reference signal as a light blocking member.

In this seventh aspect, the light blocking member of the shutter mechanism also serves as a reference mirror that is used to obtain a reference signal; accordingly, the reference mirror can be caused to advance into and withdraw from the light path of the measuring light by means of the movement mechanism that constitutes the above-mentioned shutter mechanism. Consequently, unlike the above-mentioned conventional polishing state monitoring device, the acquisition of a reference signal can be accomplished by causing a reference mirror to advance into and withdraw from the light path of the measuring light in parallel with the conveying of the object of polishing (such as a wafer) to and from the polishing positions. Accordingly, in the above-mentioned seventh aspect, the polishing throughput is improved. Furthermore, since the light blocking member of the shutter mechanism is also used as a reference mirror, the construction is simple, so that costs can be reduced.

The polishing state monitoring device that constitutes an eighth aspect of the present invention is the above-mentioned sixth aspect, wherein the above-mentioned shutter mechanism includes a dark noise measuring member (used to measure dark noise) as a light blocking member.

In this eighth aspect, the light blocking member of the shutter mechanism also serves as a dark noise measuring member that is used to measure dark noise. Accordingly, the dark noise measuring member can be caused to advance into and withdraw from the light path of the measuring light by means of the moving mechanism that constitutes the above-mentioned shutter mechanism. Consequently, unlike the above-mentioned conventional polishing state monitoring device, dark noise can be measured by causing the dark noise measuring member to advance into and withdraw from the light path of the measuring light in parallel with the conveying of the object of polishing (such as a wafer) to and from the polishing position. Accordingly, in the above-mentioned eighth aspect, the polishing throughput is improved. Furthermore, since the light blocking member of the shutter mechanism is also used as a dark noise measuring member, the construction is simple, so that costs can be reduced.

The polishing state monitoring device that constitutes a ninth aspect of the present invention is any of the above-mentioned fourth through eighth aspects, wherein the device is equipped with a second measuring light control part which causes a first period during which the above-mentioned object of polishing is illuminated with the above-mentioned measuring light, and a second period during which the above-mentioned measuring light is blocked or reduced with respect to the above-mentioned object of polishing, to be repeated during the monitoring of the above-mentioned polishing state.

If this ninth aspect is used, the polishing state monitoring method of the above-mentioned second aspect can be realized, so that the effect of the measuring light that is used to monitor the polishing state on the object of polishing can be further reduced.

The polishing state monitoring device that constitutes a tenth aspect of the present invention is the above-mentioned ninth aspect, wherein at least a portion of the above-mentioned first measuring light control part and at least a portion of the above-mentioned second measuring light control part are used in common.

In the above-mentioned ninth aspect, the above-mentioned first and second measuring light control parts may also be constructed independently of each other; however, if at least portions of these control parts are constructed in common as in the above-mentioned tenth aspect, the construction is simplified, so that costs can be reduced.

The polishing state monitoring device that constitutes an eleventh aspect of the present invention is a polishing state monitoring device in which the object of polishing is illuminated with measuring light, and the polishing state is monitored on the basis of the light obtained from the above-mentioned object of polishing as a result of this illumination with the above-mentioned measuring light, wherein the device is equipped with a measuring light control part which causes a first period during which the above-mentioned object of polishing is illuminated with the above-mentioned measuring light, and a second period during which the above-mentioned measuring light is blocked or reduced with respect to the above-mentioned object of polishing, to be repeated during the monitoring of the above-mentioned polishing state.

If this eleventh aspect is used, the polishing state monitoring method of the above-mentioned third aspect can be realized, so that the effect of the measuring light used to monitor the polishing state on the object of polishing can be reduced compared to the above-mentioned conventional technique.

The polishing state monitoring device that constitutes a twelfth aspect of the present invention is a polishing state monitoring device in which the object of polishing is illuminated with measuring light, and the polishing state is monitored on the basis of the light obtained from the above-mentioned object of polishing as a result of this illumination with the above-mentioned measuring light, wherein the device is equipped with a reference mirror which is used to obtain a reference signal, and a moving mechanism which causes the above-mentioned reference mirror to advance into and withdraw from the light path of the above-mentioned measuring light.

If this twelfth aspect is used, the reference mirror can be caused to advance into and withdraw from the light path of the measuring light by means of the moving mechanism. As a result, unlike the above-mentioned conventional polishing state monitoring device, the acquisition of a reference signal can be performed by causing the reference mirror to advance into and withdraw from the light path of the measuring light in parallel with the conveying of the object of polishing (such as a wafer) to or from the polishing position. Accordingly, the polishing throughput is improved by the above-mentioned twelfth aspect.

The polishing state monitoring device that constitutes a thirteenth aspect of the present invention is a polishing state monitoring device in which the object of polishing is illuminated with measuring light, and the polishing state is monitored on the basis of the light obtained from the above-mentioned object of polishing as a result of this illumination with the above-mentioned measuring light, wherein the device is equipped with a dark noise measuring member that is used to measure dark noise, and a moving mechanism which causes the above-mentioned dark noise measuring member to advance into and withdraw from the light path of the above-mentioned measuring light.

If this thirteenth aspect is used, the dark noise measuring member can be caused to advance into and withdraw from the light path of the measuring light by the moving mechanism. As a result, unlike the above-mentioned conventional polishing state monitoring device, dark noise can be measured by causing the dark noise measuring member to advance into and withdraw from the light path of the measuring light in parallel with the conveying of the object of polishing (such as a wafer) to or from the polishing position. Accordingly, the polishing throughput is improved by the above-mentioned thirteenth aspect.

The polishing apparatus that constitutes a fourteenth aspect of the present invention is a polishing apparatus which is equipped with a polishing body and a holding part that holds the object of polishing, and in which the above-mentioned object of polishing is polished by applying a load between the above-mentioned polishing body and the above-mentioned object of polishing, and causing relative movement between the above-mentioned polishing body and the above-mentioned object of polishing, in a state in which a polishing agent is interposed between the above-mentioned polishing body and the above-mentioned object of polishing, wherein the apparatus is equipped with the polishing state monitoring device of any of the above-mentioned fourth through thirteenth aspects.

If this fourteenth aspect is used, since the apparatus is equipped with the polishing state monitoring device of one of the fourth through thirteenth aspects, one or both of the following advantages can be obtained: specifically, the effect of the measuring light used to monitor the polishing state on the object of polishing can be reduced or eliminated, and/or the polishing throughput can be improved.

The semiconductor device manufacturing method that constitutes a fifteenth aspect of the present invention is a method which has a process in which the surfaces of semiconductor wafers are flattened using the polishing apparatus of the above-mentioned fourteenth aspect.

If this fifteenth aspect is used, the polishing apparatus of the fourteenth aspect is equipped with the polishing state monitoring device of one of the above-mentioned fourth through thirteenth aspects. Accordingly, the following advantages are obtained: specifically, the problem of oxidation of the Cu film, etc., caused by the measuring light used to monitor the polishing state can be reduced or eliminated, so that the yield can be improved, and as a result, semiconductor devices can be manufactured at a lower cost than in conventional semiconductor device manufacturing methods. Furthermore, in the above-mentioned fifteenth aspect, the following advantage can be obtained instead of or in addition to the above-mentioned advantages: specifically, the polishing throughput can be improved, so that semiconductor devices can be manufactured at a lower cost than in conventional semiconductor device manufacturing methods.

The semiconductor device that constitutes a sixteenth aspect of the present invention is a semiconductor device that is manufactured by the semiconductor device manufacturing method of the above-mentioned fifteenth aspect. If this sixteenth aspect is used, low-cost semiconductor devices can be provided.

BEST MODE FOR CARRYING OUT THE INVENTION

The polishing state monitoring method and device, polishing apparatus, semiconductor device manufacturing method and semiconductor device of the present invention will be described below with reference to the figures.

[First Working Configuration]

Figure 1:
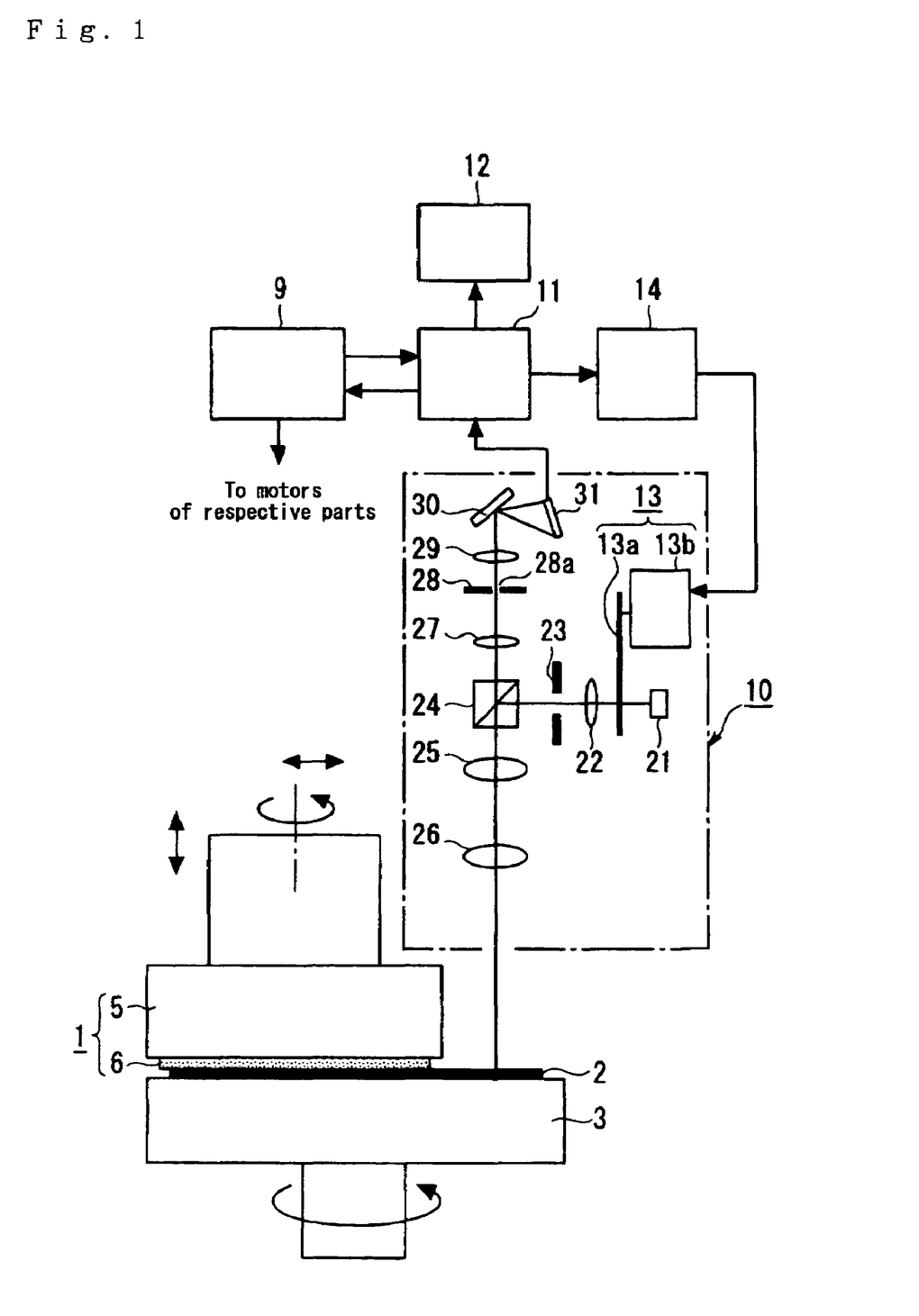
FIG. 1 is a schematic structural diagram which shows a polishing apparatus constituting a first working configuration of the present invention in model form.

FIG. 1 is a schematic structural diagram which shows a polishing apparatus constituting a first working configuration of the present invention in model form.

This polishing apparatus is equipped with a polishing member 1, an object of polishing holding part 3 (hereafter referred to as a "wafer holder") which holds (for example) a process wafer 2 having Cu as the object of polishing on the lower side of the polishing member 1, and a polishing agent supply part (not shown in the figures) which supplies a polishing agent (slurry) to the surface of the wafer 2.

The polishing member 1 has a polishing body (polishing pad) 6 disposed on the undersurface of a polishing platen 5, and can be caused to rotate (as indicated by the arrow in FIG. 1), move upward and downward and swing to the left and right (reciprocating motion) by a mechanism not shown in the figures. For example, a sheet-form foam polyurethane or a non-foam resin which has a groove structure in the surface can be used as the polishing body 6.

The wafer 2 is held on the wafer holder 3, and the upper surface of the wafer 2 is the polished surface. The wafer holder 3 can be caused to rotate as indicated by the arrow in FIG. 1 by a mechanism (not shown in the figures) using an electric motor as an actuator.

In the present working configuration, the diameter of the polishing member 1 is set so that this diameter is smaller than the diameter of the wafer 2; thus the footprint of the apparatus as a whole is small. In the present invention, however, it would also be possible to set the diameter of the polishing member 1 so that this diameter is the same as or larger than the diameter of the wafer 2. In such cases as well a portion of the wafer 2 can be temporarily exposed from the polishing member 1 by swinging the polishing member 1 during polishing. Furthermore, in cases where no portion of the wafer 2 is exposed even temporarily from the polishing member 1, a window for illuminating the wafer 2 with the measuring light may be formed in the polishing member 1 in a universally known manner.

Here, the polishing of the wafer 2 by means of this polishing apparatus will be described. The polishing member 1 is pressed against the upper surface of the wafer 2 on the wafer holder 3 by a specified pressure while the polishing member 1 rotates and swings. The wafer holder 3 is caused to rotate so that the wafer 2 is also caused to rotate, thus causing a relative movement to be performed between the wafer 2 and the polishing member 1. In this state, a polishing agent is supplied to the surface of the wafer 2 from a polishing agent supply part. This polishing agent diffuses over the surface of the wafer 2, and enters the space between the polishing body 6 and the wafer 2 as relative movement takes place between the polishing member 1 and the wafer 2, so that the polished surface of the wafer 2 is polished. Specifically, favorable polishing is accomplished as a result of a synergistic effect of the mechanical polishing caused by the relative movement of the polishing member 1 and wafer 2, and the chemical action of the polishing agent. In order to realize the above-mentioned operation required for polishing, this polishing apparatus has a polishing control part 9 which controls the motors of the respective parts that cause rotation and swinging, etc., of the polishing member 1 and rotation of the wafer holder 3.

Furthermore, as is shown in FIG. 1, this polishing apparatus is also equipped with a measurement optical system 10 which constitutes a polishing state monitoring device, a signal processing part 11 which consists of a personal computer, etc., a display part 12 such as a CRT which displays the monitoring results, and a shutter mechanism control part 14 which controls a shutter mechanism 13 installed in the measurement optical system 10.

The measurement optical system 10 illuminates the portion of the polished surface (upper surface) of the wafer 2 that is exposed from the polishing member 1 (hereafter referred to as the "exposed portion") with measuring light, and obtains a detection signal that relates to the reflected light received by a light receiving sensor that receives the light reflected by the polished surface of the wafer 2. This detection signal is input into the signal processing part 112 as a monitoring signal. On the basis of the above-mentioned detection signal, the signal processing part 11 performs processing that monitors the polishing state. In the present working configuration, the signal processing part 11 causes the polishing state to be displayed by the display part 12, ascertains the polishing endpoint, and respectively sends a polishing endpoint detection signal to the polishing control part 9 and shutter mechanism control part 14 when the polishing endpoint is detected. The polishing control part 9 ends the polishing operation in response to this polishing endpoint detection signal.

Here, the measurement optical system 10 will be described. In FIG. 1, 21 indicates a white light source which has multiple wavelength components; for example, a white LED, xenon lamp or halogen lamp can be used as this light source. If necessary, light from the light source 21 can be conducted by an optical fiber. If the light blocking member 13a of the shutter mechanism 13 (described later) is withdrawn from the light path, the light from the light source 21 is converted into a parallel light beam by a lens 22, and then passes through a visual field diaphragm 23, after which the light is caused to be incident on a beam splitter 24. The direction of this light is altered 90° by the beam splitter 24; the light then passes through relay lenses 25 and 26, and is again converted into a parallel light beam and directed onto the exposed portion of the polished surface of the wafer 2 as measuring light.

The light reflected from the wafer 2 again passes through the relay lenses 26 and 25, and is caused to be incident on the beam splitter 24 as a parallel light beam. This light passes through the beam splitter 24, and is focused on the pinhole (this may also be a slit) 28a of a light blocking plate 28 by a lens 27. Then, noise components such as scattered light and diffracted light are removed by the light blocking plate 28, and the light passing through the pinhole 28a (regular reflected light (zero-order light)) is projected via a lens 29 onto a diffraction grating (this may also be some other spectroscopic device such as a spectroscopic prism) 30 that is used as a spectroscopic device, so that the light is separated into a spectrum. The light that has been separated into a spectrum enters a linear sensor 31 used as a light receiving sensor, and the spectroscopic intensity (intensity at respective wavelengths, i.e., spectrum) is measured.

In the present working configuration, the signal processing part 11 calculates the polishing state monitoring results for the wafer 2 on the basis of the spectroscopic intensity obtained from the linear sensor 31, causes these results to be displayed on the display part 12, ascertains the polishing endpoint, and respectively sends a polishing endpoint detection signal to the polishing control part 9 and shutter mechanism control part 14 when the polishing endpoint is detected. For example, the film thickness of the layer that is being polished (uppermost layer) is calculated from characteristic quantities such as the positions (wavelength) of maxima and minima of the waveform of the spectroscopic intensity (corresponding to the spectroscopic reflectivity), and this film thickness is displayed on the display part 12 as the results of monitoring; furthermore, the polishing endpoint is detected according to whether or not this film thickness has reached a specified film thickness. Furthermore, for example, the amount of polishing is determined from the initial thickness of the wafer 2 and the film thickness of the layer that is being polished (uppermost layer), and this value is displayed on the display part 12 as the results of monitoring. Of course, the calculation method used to determine the monitoring results from the spectroscopic intensity and the method used to detect the polishing endpoint are not limited to the examples described above; for example, other methods such as those disclosed in Japanese Patent Application Kokai No. H10-335288 and Japanese Patent Application Kokai No. H11-33901 may also be used.

Furthermore, in the present working configuration, as was described above, the measurement optical system 10 performs spectroscopic reflection measurements, and the signal processing part 11 monitors the polishing state on the basis of the spectroscopic reflection intensity. However, the present invention is not limited to such an arrangement; for example, it would also be possible to construct the device of the present invention so that the measurement optical system 10 performs measurements of reflected light that do not depend on spectroscopy (e.g., measurements of the reflectivity of light at a specified wavelength), and so that the polishing endpoint is detected on the basis of the reflectivity measured by the measurement optical system 10. This is also true of the respective working configurations described later.

Furthermore, in the present working configuration, as was described above, a mechanical shutter mechanism 13 is installed in the measurement optical system 10. In the present working configuration, the shutter mechanism 13 is constructed from a light blocking member 13a, and a motor 13b such as a stepping motor as a moving mechanism that causes the light blocking member 13a to advance into and withdraw from the light path between the light source 21 and the lens 22 (this mechanism may be installed at any location in the light path between the light source 21 and the wafer 2). Although this is not shown in the figures, the light source 21 is driven so that the light source is continuously lit with a fixed quantity of light when the power supply is switched on. Furthermore, it would also be possible to use a light reducing filter instead of the light blocking member 13a.

In response to a monitoring start command that is issued from the polishing control part 9 and sent to the shutter mechanism control part 14 via the signal processing part 11, the shutter mechanism control part 14 controls the motor 13b so that the light blocking member 13a is withdrawn from the light path. Furthermore, the monitoring start command may be issued at the time that the polishing of the wafer 2 is initiated, or may be issued after a specified period of time has elapsed following the initiation of the polishing of the wafer 2. Moreover, in response to a polishing endpoint detection signal from the signal processing part 11, the shutter mechanism control part 14 controls the motor 13b so that the light blocking member 13a advances into the light path. As a result of this control as is shown in FIG. 2, the wafer 2 is illuminated with measuring light only during the period extending from the point in time t1 at which the monitoring start command is received to the point in time t2 at which the polishing endpoint detection signal is received.

In the present working configuration, as is clear from the above description, the shutter mechanism 13 and shutter mechanism control part 14 constitute a first measuring light control part which blocks the measuring light (or reduces the measuring light in cases where a light reducing filter is used instead of the light blocking member 13a) with respect to the wafer 2 in response to the polishing endpoint detection signal.

In the present working configuration, the measuring light used to monitor the polishing state is blocked or reduced with respect to the wafer 2 after the polishing endpoint of the wafer 2 has been detected. Accordingly, the effect of the measuring light used to monitor the polishing state on the wafer 2 can be reduced or eliminated.

Figure 2:
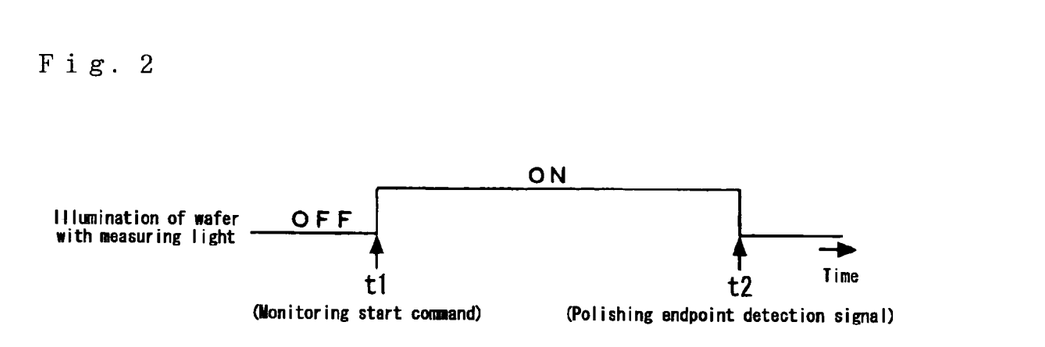
FIG. 2 is a time chart which shows one example of the illumination pattern of the measuring light with respect to the wafer.

In the present working configuration, as is shown in FIG. 2, the wafer 2 is continuously illuminated with a fixed quantity of measuring light during the monitoring of the polishing state (i.e., during the time period extending from the point in time t1 at which the monitoring start command is received to the point in time t2 at which the polishing endpoint detection signal is received).

Figure 3:
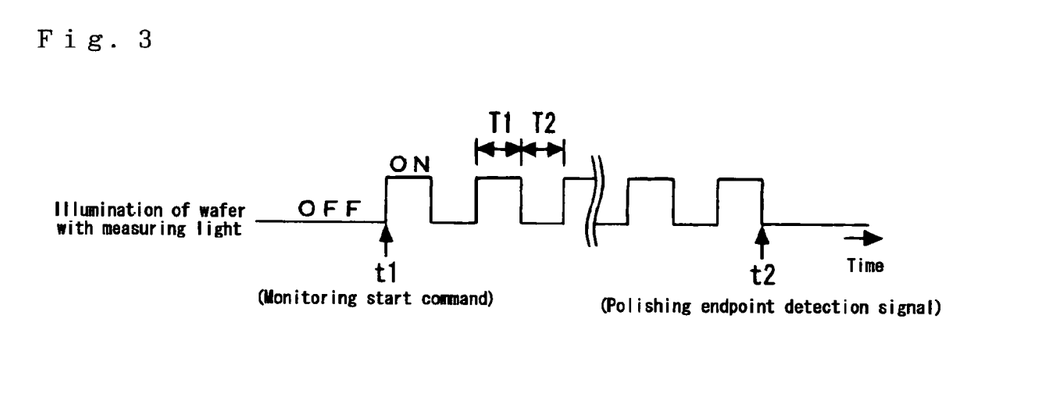
FIG. 3 is a time chart which shows another example of the illumination pattern of the measuring light with respect to the wafer.

On the other hand, in the present invention, the system may also be arranged so that a first period T1 during which the wafer 2 is illuminated with the measuring light, and a second period T2 during which the measuring light is blocked (or reduced) with respect to the wafer 2, are repeated during the monitoring of the polishing state as shown in FIG. 3. In this case, the system may be devised as follows: specifically, in response to a monitoring start command, the shutter mechanism control part 14 continues to cause the motor 13b to rotate continuously (here, the measuring light is chopped by the light blocking member 13a), and in response to the polishing endpoint detection signal, the shutter mechanism control part 14 stops the motor 13b so that the light blocking member 13a stops in a position in which this member has advanced into the light path. In this case, although this is not shown in the figures, the system may be devised so that (for example) a position detector such as an encoder which detects the rotational position of the motor 13b is installed, detection of the light that is incident on the linear sensor 31 during the period T1 in which the light is not blocked by the light blocking member 13a is performed in synchronization with signals from the above-mentioned position detector, and data input of the light detection signal and calculations such as film thickness calculations and endpoint determination based on this data input are performed during the period T2 in which the light is blocked by the light blocking member 13a.

In this case, the shutter mechanism 13 and shutter mechanism control part 14 also function as a second measuring light control part which causes a first period T1 during which the wafer 2 is illuminated with the measuring light, and a second period T2 during which the measuring light is blocked (or reduced) with respect to the wafer 2, to be repeated during the monitoring of the polishing state.

In cases where an illumination pattern of the measuring light with respect to the wafer 2 such as that shown in FIG. 3 is realized, if the wafer 2 is illuminated with the measuring light even before the polishing of the wafer 2 is completed, the total quantity of light with which the wafer 2 is illuminated during the monitoring of the polishing state of the wafer 2 is reduced; accordingly, even in cases where the measuring light has a deleterious effect on the wafer 2, this effect of the measuring light on the wafer 2 can be greatly reduced.

In the present invention, furthermore, in cases where the periods T1 and T2 are repeated as shown in FIG. 3, it is not absolutely necessary that the measuring light be blocked or reduced with respect to the wafer 2 in response to the polishing endpoint detection signal.

In addition, in the present invention, it would also be possible to use an electro-optical-type shutter such as a liquid crystal shutter, instead of the mechanical shutter mechanism 13 shown in FIG. 1.

[Second Working Configuration]

Figure 4:
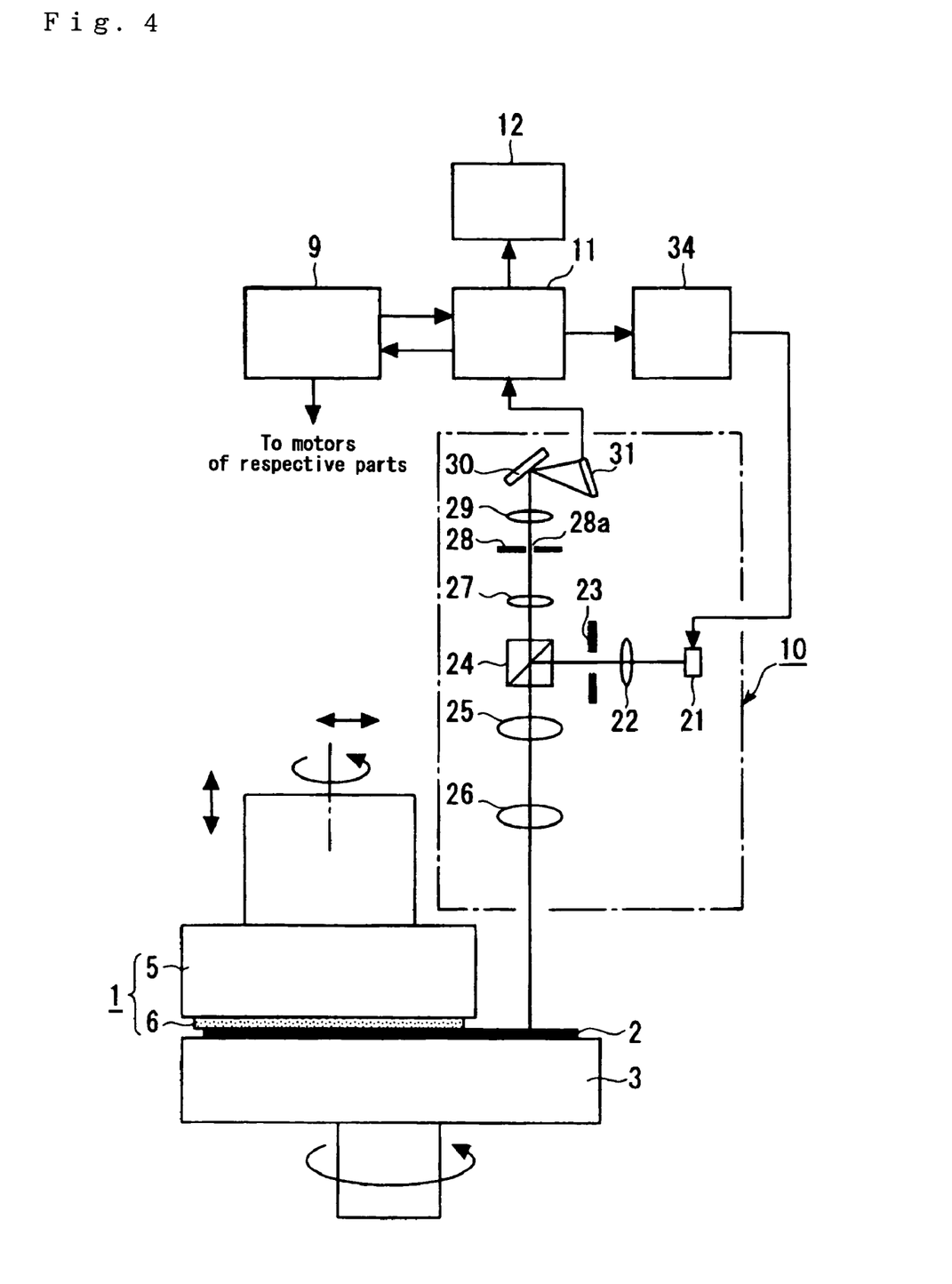
FIG. 4 is a schematic structural diagram which shows a polishing apparatus constituting a second working configuration of the present invention in model form.

FIG. 4 is a schematic structural diagram which shows a polishing apparatus constituting a second working configuration of the present invention in model form. In FIG. 4, elements that are the same as in FIG. 1, or that correspond to elements in FIG. 1, are labeled with the same symbols, and a redundant description is omitted.

The present working configuration differs from the above-mentioned first working configuration only in that a light source control part 34 is used instead of the shutter mechanism 13 and shutter mechanism control part 14. A light source which causes no problems in terms of useful life or response characteristics when switched on and off by electrical control, e.g., a white LED, is used as the light source 21. The light source control part 34 electrically controls the light-emitting state of the light source 21 so that an illumination pattern of the measuring light with respect to the wafer 2 such as that shown in FIG. 2 (which is similar to the above-mentioned first working configuration) is realized. Alternatively, the light source control part 34 may electrically control the light-emitting state of the light source 21 so that an illumination pattern of the measuring light with respect to the wafer 2 such as that shown in the above-mentioned FIG. 3 is realized. Furthermore, it would also be possible to devise the system so that the emission of light by the light source 21 is not completely stopped in the OFF periods in FIGS. 2 and 3, but is instead reduced (reduced-light state).

Advantages similar to those of the above-mentioned first working configuration can also be obtained in this working configuration.

[Third Working Configuration]

Figure 5:
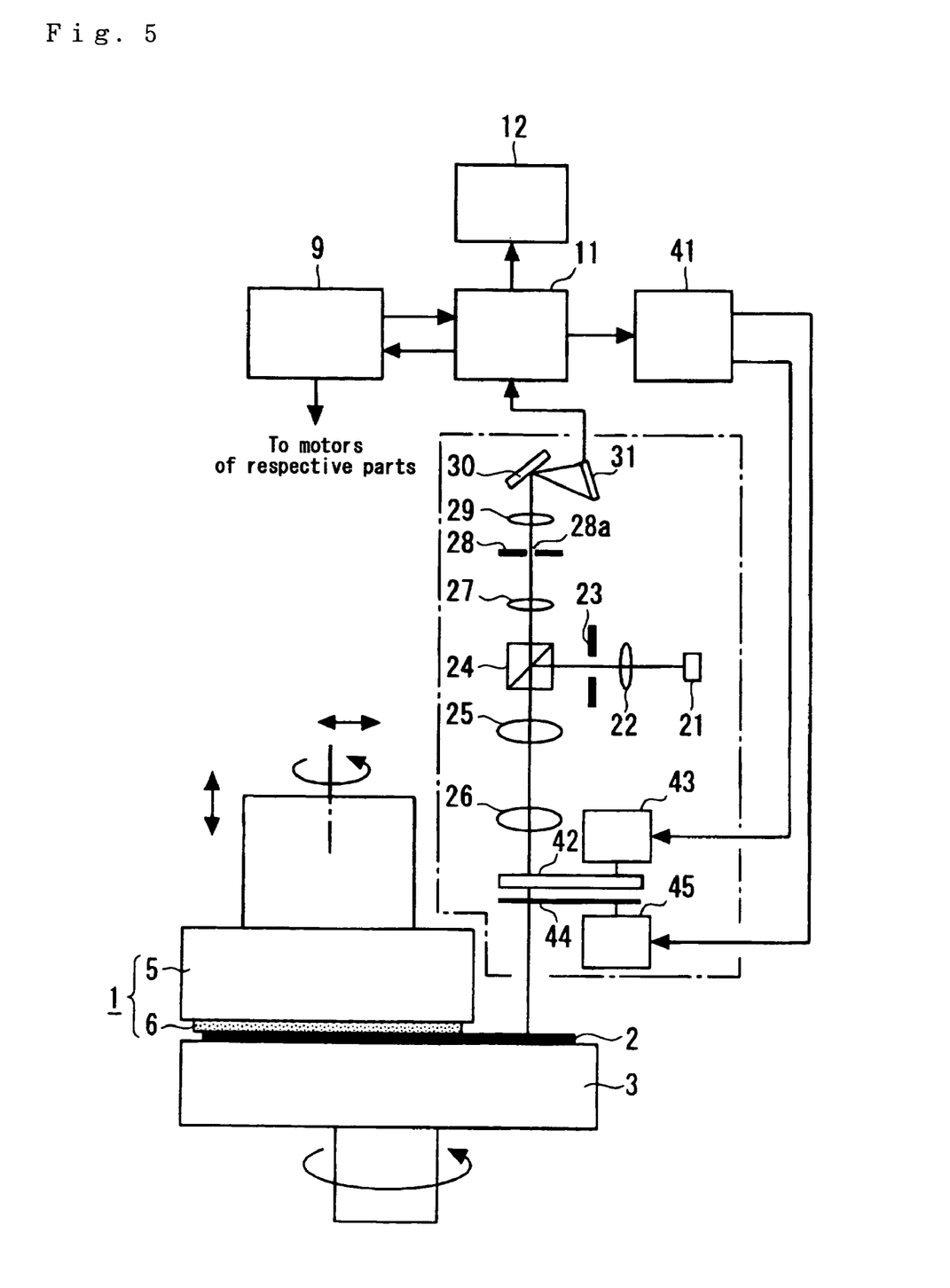
FIG. 5 is a schematic structural diagram which shows a polishing apparatus constituting a third working configuration of the present invention in model form.

FIG. 5 is a schematic structural diagram which shows a polishing apparatus constituting a third working configuration of the present invention in model form. In FIG. 5, elements that are the same as in FIG. 1, or that correspond to elements in FIG. 1, are labeled with the same symbols, and a redundant description is omitted.

The respects in which the present working configuration differs from the above-mentioned first working configuration are described below. Specifically, in the present working configuration, the shutter mechanism 13 and shutter mechanism control part 14 shown in FIG. 1 are removed. Meanwhile, in the present working configuration, a reference mirror 42 which has specified reflection characteristics and which is used to acquire a reference signal, a motor 43 which is used as a moving mechanism that causes the reference mirror 42 to advance into and withdraw from the light path of the measuring light at a point closest to the wafer 2 among the positions of all of the optical elements, etc., a dark noise measuring member 44 which absorbs light more or less completely and which is used to measure dark noise, a motor 45 which is used as a moving mechanism that causes the dark noise measuring member 44 to advance into and withdraw from the light path of the measuring light at a point closest to the wafer 2 among the positions of all of the optical elements, etc., and a control part 41 which controls the motors 43 and 45, are added.

In the present working configuration, the control part 41 receives a reference signal acquisition start command (ordinarily issued with an appropriate timing other than during the polishing of the wafer 2) from the polishing control part 9 via the signal processing part 11; in response to this command, the control part 41 controls the motor 43 so that the reference mirror 42 advances into the light path. When the reference mirror 42 has advanced into the light path, the signal processing part 11 inputs a signal from the linear sensor 31 as a reference signal. This reference signal is used as a reference for comparison with the measurement signal from the linear sensor 31 that is obtained by illuminating the wafer 2 with the measuring light during the monitoring of the polishing state; the above-mentioned calculation of the film thickness, etc., is performed on the basis of this comparison. Then, in response to a reference signal acquisition end command issued from the signal processing part 11 when the acquisition of the reference signal is ended, the control part 41 controls the motor 43 so that the reference mirror 42 is withdrawn from the light path.

Furthermore, in the present working configuration, the control part 41 receives a dark noise measurement start command (ordinarily issued with an appropriate timing other than during the polishing of the wafer 2) from the polishing control part 9 via the signal processing part 11; in response to this command, the control part 41 controls the motor 45 so that the dark noise measuring member 44 advances into the light path. When the dark noise measuring member 44 has advanced into the light path, the signal processing part 11 inputs a signal from the linear sensor 31 as a dark noise measurement signal. This measurement signal is used to subtract the dark noise component from the measurement signal of the linear sensor 31 that is obtained by illuminating the wafer 2 with measuring light during the monitoring of the polishing state; the calculation of the above-mentioned film thickness, etc., is performed on the basis of the signal obtained by this subtraction. Then, in response to a dark noise measurement end command issued from the signal processing part 11 when the measurement of dark noise is ended, the control part 41 controls the motor 45 so that the dark noise measuring member 44 is withdrawn from the light path.

In the present working configuration, the acquisition of a reference signal and the measurement of dark noise can be accomplished by respectively causing the reference mirror 42 and dark noise measuring member 44 to advance into and withdraw from the light path of the measuring light by means of the motors 43 and 45. Accordingly, in the present working configuration, the acquisition of a reference signal and the measurement of dark noise can be performed in parallel with the conveying of the wafer 2 to and from the polishing position, so that the polishing throughput is improved. Furthermore, in the present working configuration, the acquisition of a reference signal and the measurement of dark noise can be frequently performed while improving the polishing throughput; accordingly, the polishing state of the wafer 2 can be monitored on the basis of the most recent reference signal or dark noise, and the precision of the monitoring of the polishing state can therefore be improved.

In the present working configuration, it is not absolutely necessary to realize an illumination pattern of the measuring light with respect to the wafer 2 such as that shown in the above-mentioned FIG. 2 or FIG. 3; the wafer 2 could also be constantly illuminated with a fixed quantity of light both during the monitoring of the polishing state and after polishing is completed.

However, in the present working configuration as well, it goes without saying that it is desirable to realize an illumination pattern of the measuring light with respect to the wafer 2 such as that shown in the above-mentioned FIG. 2 or FIG. 3 in cases where the measuring light has an effect on the object of polishing. In this case, since the reference mirror 42 and dark noise measuring member 44 act as light blocking members that block the measuring light with respect to the wafer 2, the motor 43 and reference mirror 42, or the motor 45 and dark noise measuring member 44, can also be used as shutter mechanisms that correspond to the mechanical shutter mechanism 13 shown in FIG. 1. In this case, the control part 41 may be constructed so that this control part 41 performs a control action similar to that of the shutter mechanism control part 14 in FIG. 1. In the present working configuration, it would also be possible to install the mechanical shutter mechanism 13 shown in FIG. 1 separately from the motors 43 and 45 and mirror 42 and member 44. However, if the above-mentioned parts serve a double purpose as described above, the construction is simplified, so that costs can be reduced.

[Fourth Working Configuration]

Figure 6:
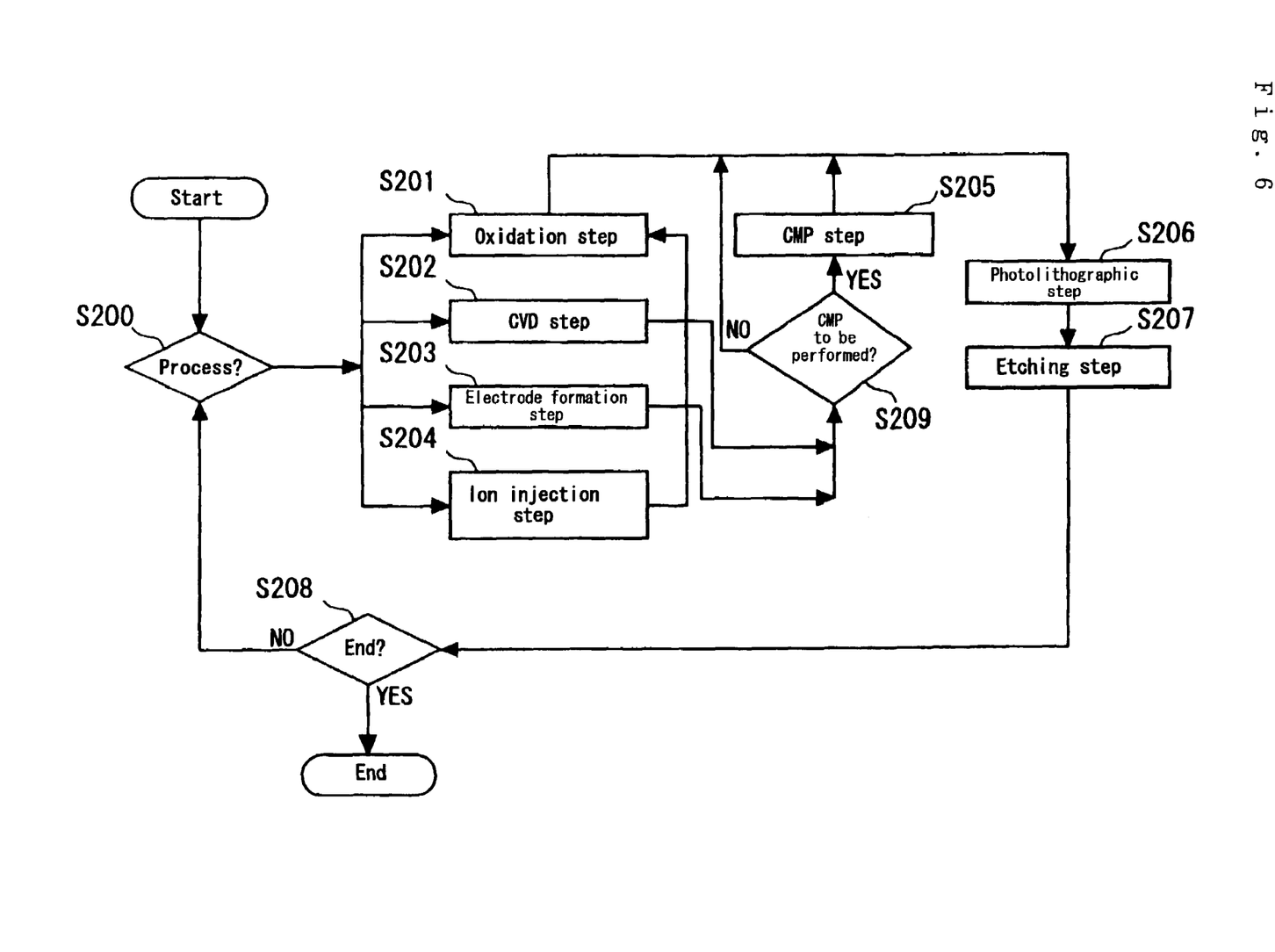
FIG. 6 is a flow chart which shows a semiconductor device manufacturing process constituting a working configuration of the present invention.

FIG. 6 is a flow chart which illustrates a semiconductor device manufacturing process. When the semiconductor device manufacturing process is started, the appropriate treatment step is first selected in step S200 from the steps S201 through S204 described below. The processing then proceeds to one of the steps S201 through S204 in accordance with this selection.

Step S201 is an oxidation step in which the surface of the silicon wafer is oxidized. Step S202 is a CVD step in which an insulating film is formed on the surface of the silicon wafer by CVD, etc. Step S203 is an electrode formation step in which an electrode film is formed on the silicon wafer by vacuum evaporation, etc. Step S204 is an ion injection step in which ions are injected into the silicon wafer.

Following the CVD step or electrode formation step, the processing proceeds to step S209, and a judgement is made as to whether or not a CMP step is to be performed. In cases where such a step is not to be performed, the processing proceeds to step S206, while in cases where such a step is to be performed, the processing proceeds to step S205. Step S205 is a CMP step; in this step, the flattening of inter-layer insulating films or the formation of a damascene by polishing a metal film (Cu film, etc.) on the surface of a semiconductor device is performed using the polishing apparatus of the present invention.

Following the CMP step or oxidation step, the processing proceeds to step S206. Step S206 is a photolithographic step. In this photolithographic step, the silicon wafer is coated with a resist, circuit patterns are burned onto the silicon wafer by exposure using an exposure apparatus, and the exposed silicon wafer is developed. Furthermore, the next step S207 is an etching step in which the portions other than the developed resist image are removed by etching, the resist is then peeled away, and the resist that has become unnecessary following etching is removed.

Next, in step S208, a judgement is made as to whether or not all of the necessary steps have been completed. If these steps have not bee been completed, the processing returns to step S200, and the subsequent steps are repeated, so that circuit patterns are formed on the silicon wafer. If it is judged in step S208 that all of the steps have been completed, the process is ended.

In the semiconductor device manufacturing method of the present invention, the polishing apparatus of the present invention is used in the CMP step. Accordingly, the danger of problems such as oxidation of the Cu film, etc., caused by the measuring light used to monitor the polishing state is reduced or eliminated, so that the yield can be improved. As a result, the following advantage is obtained: namely, semiconductor devices can be manufactured at a lower cost than in conventional semiconductor device manufacturing methods. Furthermore, in the semiconductor device manufacturing method of the present invention, the following advantage is also obtained instead of or in addition to the above-mentioned advantage: namely, the polishing throughput can be improved, so that semiconductor devices can be manufactured at a lower cost than in conventional semiconductor device manufacturing methods. As a result, the present invention has the effect of achieving the manufacture of semiconductor devices at a lower cost than in conventional semiconductor device manufacturing methods.

Furthermore, the polishing apparatus of the present invention may also be used in the CMP steps of semiconductor device manufacturing processes other than the semiconductor device manufacturing process described above.

The semiconductor device of the present invention is manufactured by the semiconductor device manufacturing method of the present invention. As a result, this semiconductor device can be manufactured at a lower cost than in conventional semiconductor device manufacturing methods, which has the effect of reducing the manufacturing cost of the semiconductor device.

Respective working configurations of the present invention were described above; however, the present invention is not limited to these working configurations.

INDUSTRIAL APPLICABILITY

As was described above, the present invention can be used (for example) to manufacture semiconductor devices and to polish wafers in the manufacturing process of such semiconductor devices.

The invention claimed is:

1. A polishing state monitoring method in which an object of polishing is illuminated with measuring light, and the polishing state of the object of polishing is monitored during the polishing of the object of polishing on the basis of the light obtained from the object of polishing as a result of illumination with the measuring light,
wherein a polishing endpoint of the object of polishing is ascertained and a polishing endpoint detecting signal is delivered when the polishing endpoint is detected and in response to the polishing endpoint detecting signal the measuring light is blocked or reduced with respect to the object of polishing by a first measuring light control part.

2. The polishing state monitoring method according to claim 1, wherein a first period during which the object of polishing is illuminated with the measuring light, and a second period during which the measuring light is blocked or reduced with respect to the object of polishing, are repeated during the monitoring of the polishing state.

3. A polishing state monitoring device in which an object of polishing is illuminated with measuring light, and the polishing state is monitored on the basis of the light that is obtained from the object of polishing as a result of illumination with the measuring light,
wherein the device is equipped with a signal processing part that ascertains a polishing endpoint of the object of polishing and delivers a polishing endpoint detecting signal when the polishing endpoint is detected and a first measuring light control part that blocks or reduces the measuring light with respect to the object of polishing in response to the polishing endpoint detection signal.

4. The polishing state monitoring device according to claim 3, wherein the first measuring light control part includes a control part that electrically controls a light-emitting state of a the light source.

5. The polishing state monitoring device according to claim 3, wherein the first measuring light control part includes a mechanical shutter mechanism.

6. The polishing state monitoring device according to claim 5, wherein the shutter mechanism includes a reference mirror that is used to obtain a reference signal as a light blocking member.

7. The polishing state monitoring device according to claim 5, wherein the shutter mechanism includes a dark noise measuring member (used to measure dark noise) as a light blocking member.

8. The polishing state monitoring device according to claim 3, wherein the device is equipped with a second measuring light control part which causes a first period during which the object of polishing is illuminated with the measuring light, and a second period during which the measuring light is blocked or reduced with respect to the object of polishing, to be repeated during the monitoring of the polishing state.

9. The polishing state monitoring device according to claim 8, wherein at least a portion of the first measuring light control part and at least a portion of the second measuring light control part are used in common.

10. A polishing apparatus which is equipped with a polishing body and a holding part that holds an object of polishing, and in which the object of polishing is polished by applying a load between the polishing body and the object of polishing, and causing relative movement between the polishing body and the object of polishing, in a state in which a polishing agent is interposed between the polishing body and the object of polishing,
wherein the apparatus is equipped with a polishing state monitoring device in which the object of polishing is illuminated with measuring light, and the polishing state is monitored on the basis of light that is obtained from the object of polishing as a result of illumination with the measuring light,
wherein the device is equipped with a signal processing part that ascertains a polishing endpoint of the object of polishing and delivers a polishing endpoint detecting signal when the polishing endpoint is detected, and a first measuring light control part that blocks or reduces the measuring light with respect to the object of polishing in response to the polishing endpoint detection signal.

11. The polishing apparatus according to claim 10, wherein the first measuring light control part includes a control part that electrically controls a light-emitting state of a light source.

12. The polishing apparatus according to claim 10, wherein the first measuring light control part includes a mechanical shutter mechanism.

13. The polishing apparatus according to claim 12, wherein the shutter mechanism includes a reference mirror that is used to obtain a reference signal as a light blocking member.

14. The polishing apparatus according to claim 12, wherein the shutter mechanism includes a dark noise measuring member (used to measure dark noise) as a light blocking member.

15. The polishing apparatus according to any of claims 10 and 11 to 14, wherein the polishing state monitoring device is equipped with a second measuring light control part which causes a first period during which the object of polishing is illuminated with the measuring light, and a second period during which the measuring light is blocked or reduced with respect to the object of polishing, to be repeated during the monitoring of the polishing state.

16. The polishing apparatus according to claim 15, wherein at least a portion of the first measuring light control part and at least a portion of the second measuring light control part are used in common.

* * * * *